United States Patent [19]

Seesink

[11] Patent Number: 5,506,526
[45] Date of Patent: Apr. 9, 1996

[54] OFFSET-COMPENSATED SAMPLE AND HOLD ARRANGEMENT AND METHOD FOR ITS OPERATION

[75] Inventor: Petrus H. Seesink, Eindhoven, Netherlands

[73] Assignee: Sierra Semiconductor B.V., 'S-Hertogenbosch, Netherlands

[21] Appl. No.: 290,862

[22] PCT Filed: Feb. 18, 1993

[86] PCT No.: PCT/NL93/00038

§ 371 Date: Oct. 17, 1994

§ 102(e) Date: Oct. 14, 1994

[87] PCT Pub. No.: WO93/17436

PCT Pub. Date: Sep. 2, 1993

[30] Foreign Application Priority Data

Feb. 21, 1992 [NL] Netherlands ............... 9200327

[51] Int. Cl.$^6$ ................................. G11C 27/02
[52] U.S. Cl. ................. 327/91; 327/94; 327/95; 327/337; 327/554
[58] Field of Search ................. 327/91, 93, 94, 327/95, 72, 62, 87, 88, 89, 77, 78, 79, 362, 336, 337, 341, 554, 558; 330/9

[56] References Cited

U.S. PATENT DOCUMENTS 4,331,894  5/1982  Gregorian et al. ................. 327/95
4,439,693  3/1984  Lucas et al. ..................... 327/94
4,714,843  12/1987  Smith ............................. 327/91

FOREIGN PATENT DOCUMENTS 0275590  7/1988  European Pat. Off. .
3-256408  11/1991  Japan .

OTHER PUBLICATIONS

"GaAs Switched–Capacitor Circuits for High-Speed Signal Processing", *IEEE Journal of Solid–State Circuits*, vol. 22, No. 6, Dec. 1987, New York, by Lawrence E. Larson et al., pp. 971–981.

*Primary Examiner*—Timothy P. Callahan
*Assistant Examiner*—Eunja Shin
*Attorney, Agent, or Firm*—Young & Thompson

[57] ABSTRACT

Offset-compensated sample and hold arrangement to sample an input signal comprising at least an operational amplifier (A), a first capacitor (C1), a second capacitor (C2), a first switch (S110), a second switch (S211), a third switch (S210), a fourth switch (S111), a fifth switch (S120), a sixth switch (S121), a seventh switch (S220) and an eighth switch (S221), which switches capacitors and operational amplifier are interconnected in such a way and may be switched in such a way that during an offset-compensation phase the output voltage will only experience a very small voltage change.

7 Claims, 5 Drawing Sheets

PRIOR-ART

PRIOR-ART

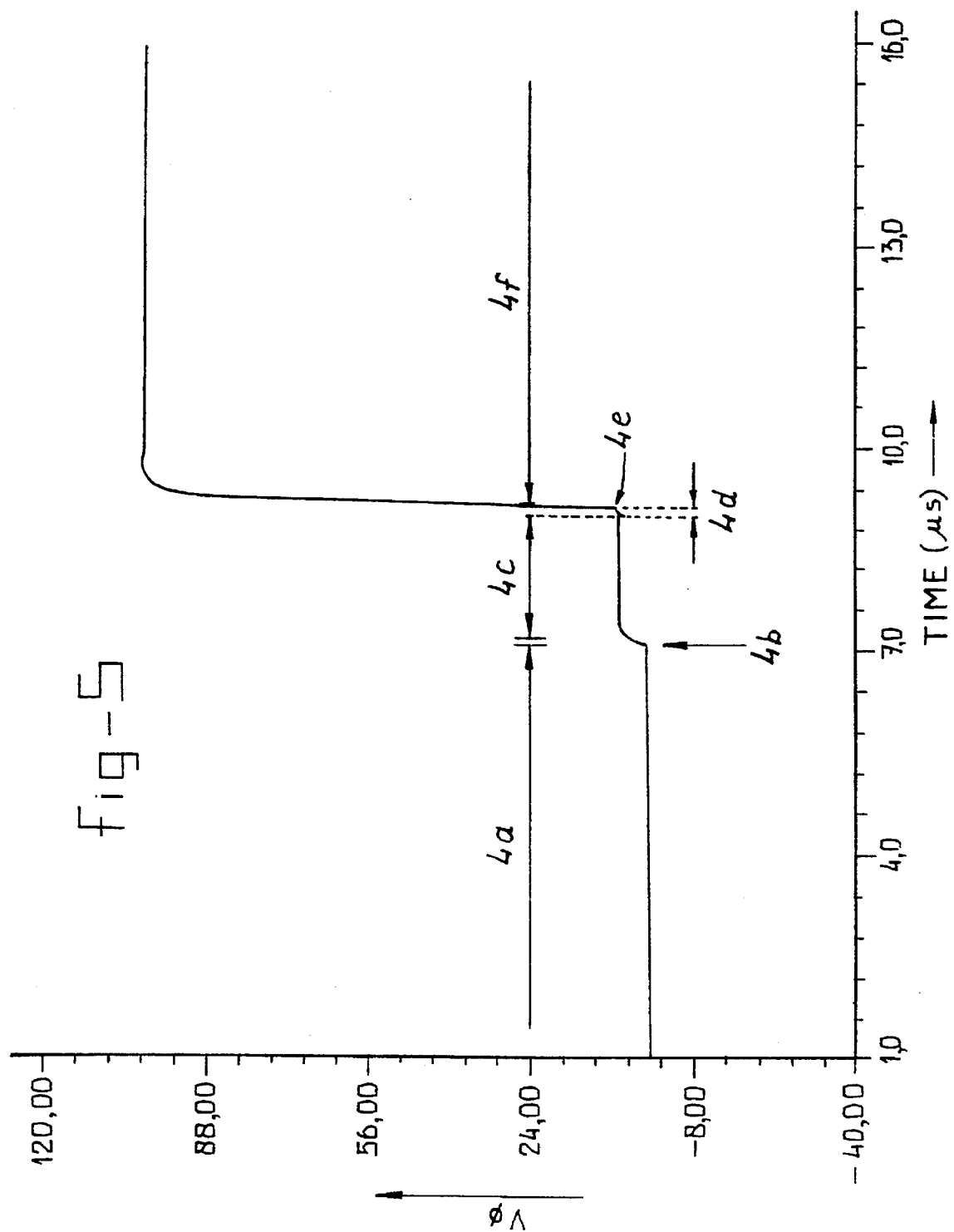

OFFSET-COMPENSATED SAMPLE AND HOLD ARRANGEMENT AND METHOD FOR ITS OPERATION

BACKGROUND OF THE INVENTION

1. Field of the Invention

The invention relates to a sample and hold arrangement to sample an input signal comprising at least an operational amplifier having an inverting input, a non-inverting input connected to a reference voltage (or ground) and an output, a first capacitor one side of which may be connected through a first switch to the input voltage, a second capacitor one side of which may be connected to the output of the operational amplifier through a second switch.

2. Description of Related Art

Such an arrangement is known from U.S. Pat No. 4,439,693. The operation of this known arrangement will be first discussed referring to FIGS. 1a and b, which are derive from FIGS. 3a and b of said patent publication. The known arrangement has as an objective to prevent that the offset voltage at the input of the operational amplifier 10 influences the output signal Vout of the sample and hold arrangement. Therefore, the prior art arrangement performs two steps. In the first step (FIG. 1a) the output and the inverting input of the operational amplifier 10 are connected to one another and the resulting offset voltage of the operational amplifier is stored on both the first capacitor Cin and the second capacitor CF. The first capacitor Cin is connected between the inverting input and the input voltage to be sampled, while the second capacitor CF is at that moment connected between the inverting input and the reference voltage (or ground). In the second step the direct connection 44 between the output and the inverting input of the operational amplifier is disconnected and the second capacitor CF is connected between the output and the inverting input of the operational amplifier. Thereby, a voltage of equal magnitude as the offset voltage but having opposite polarity as the original offset voltage is added to the offset voltage present at the input of the operational amplifier, in such a way that the influence of the offset voltage is neutralized.

Consequently, in this prior art arrangement the output voltage of the circuit is made equal to the offset voltage during the compensation phase. Because just before the previous sample is still at the output, the output voltage, therefore, generally has to make a large voltage step. Therefore, higher demands have to be met regarding the rate of the operational amplifier applied. Furthermore, as the output voltage of the prior art circuit is equal to the offset voltage during the compensation phase no continuous-time low pass filter can be applied to reconstruct the original signal. During the compensation phase, however, the output signal is no function of the input signal, so that the output signal of a low pass filter eventually applied would depend substantially on the offset voltage. Therefore, the prior art circuit may be only applied in such cases where the output signal of the sample and hold arrangement is only processed in a discrete-time way and the magnitude of the output signal during the compensation phase is of no significance.

Moreover, in the prior art circuit the accuracy depends on the extent to which the two capacitors are similar to one another. An accuracy of 0.01% is claimed, however, because of the more limited relative matching of capacitors on a chip (typical value 0.1%) this must be worse.

SUMMARY OF THE INVENTION

It is an object of the invention to provide a sample and hold arrangement having offset compensation and a low glitch output signal. Therefore, the sample and hold arrangement according to the invention is characterized in that the sample and hold arrangement furthermore comprises a third switch one side of which is connected to the input voltage and the other side of which is connected to said one side of the second capacitor, a fourth switch one side of which is connected to said one side of the first capacitor and the other side of which is connected to the output of the operational amplifier, a fifth switch one side of which is connected to the other side of the first capacitor as well as to one side of a sixth switch one side of which is connected to the reference voltage, while the other side of the fifth switch is connected to the inverting input of the operational amplifier, a seventh switch one side of which is connected to the other side of the second capacitor as well as to one side of an eighth switch the other side of which is connected to the reference voltage, while the other side of the seventh switch is also connected to the inverting input of the operational amplifier.

By applying these measures a higher degree of offset compensation is reached, while the output signal of the sample and hold arrangement is substantially continuous. The sample and hold arrangement according to the invention, therefore, may be utilized both in a discrete-time and a continuous-time way.

Furthermore the invention relates to a method for the operation of the switches in the sample and hold arrangement, wherein the following steps are carried out to sample the input voltage:

a. closing or keeping closed the first, the second, the sixth and the seventh switches and opening or keeping opened the other switches;

b. opening said sixth switch;

c. closing said fifth switch;

d. opening said first switch;

e. opening said second and seventh switches;

f. closing said fourth and eighth switches.

The main advantage obtained by this method is that there is a permanent voltage at the output of the sample and hold arrangement, which voltage is substantially equal to a sample. During the compensation phase the offset voltage is added to the present output voltage (i.e. the last sample) and the output voltage is not, as is the case in the prior art arrangement, substituted by the offset voltage. The offset voltage (typical value<5 mV) being generally much smaller than the sampled voltage the voltage change at the output during the compensation phase is, therefore, much smaller than in the prior art arrangement. Therefore, the utilized operational amplifier has to meet less stringent demands regarding the slew rate. Moreover, at the output a continuous-time low pass filter may be applied. Moreover, the ratio between both capacitors substantially has no influence on the accuracy of the circuit.

In a first preferred embodiment the first, third, sixth and eighth switches are significantly larger than the other switches in order to sample the input voltage faster.

In an other preferred embodiment of the sample and hold arrangement according to the invention the first switch comprises a first relatively large switch and a first relatively small switch parallel to one another and said third switch comprises a third relatively large switch and a third relatively small switch parallel to one another.

A method for the operation of the switches in this last-mentioned embodiment of the invention is characterized in that said opening of said first switch comprising two parallel switches in step d occurs in two substeps:

d1. opening said first relatively large switch;

d2. opening said first relatively small switch.

By applying these measures the consequences of clock feedthrough of the first (or second) switch are reduced: opening first of all only the large switch the switch effect of the large switch is short circuited through the small switch which is still closed. By opening afterwards the small switch only a much smaller switching effect of the small switch results.

BRIEF DESCRIPTION OF THE DRAWING

The invention will be explained hereinafter referring to the drawings, which are meant to illustrate and not to limit the scope of the present invention. In the figures:

FIG. 5 shows a possible voltage curve at the output of the arrangement according to FIG. 2.

DETAILED DESCRIPTION OF PREFERRED EMBODIMENTS

Figure 1A:
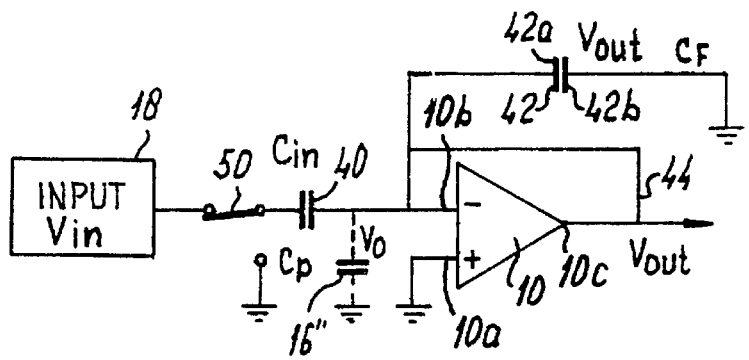
FIGS. 1a and b show a sample and hold arrangement according to the prior art.
Figure 1B:
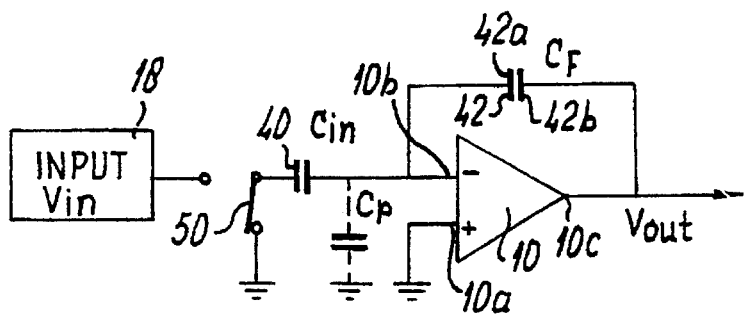
Figure 2:
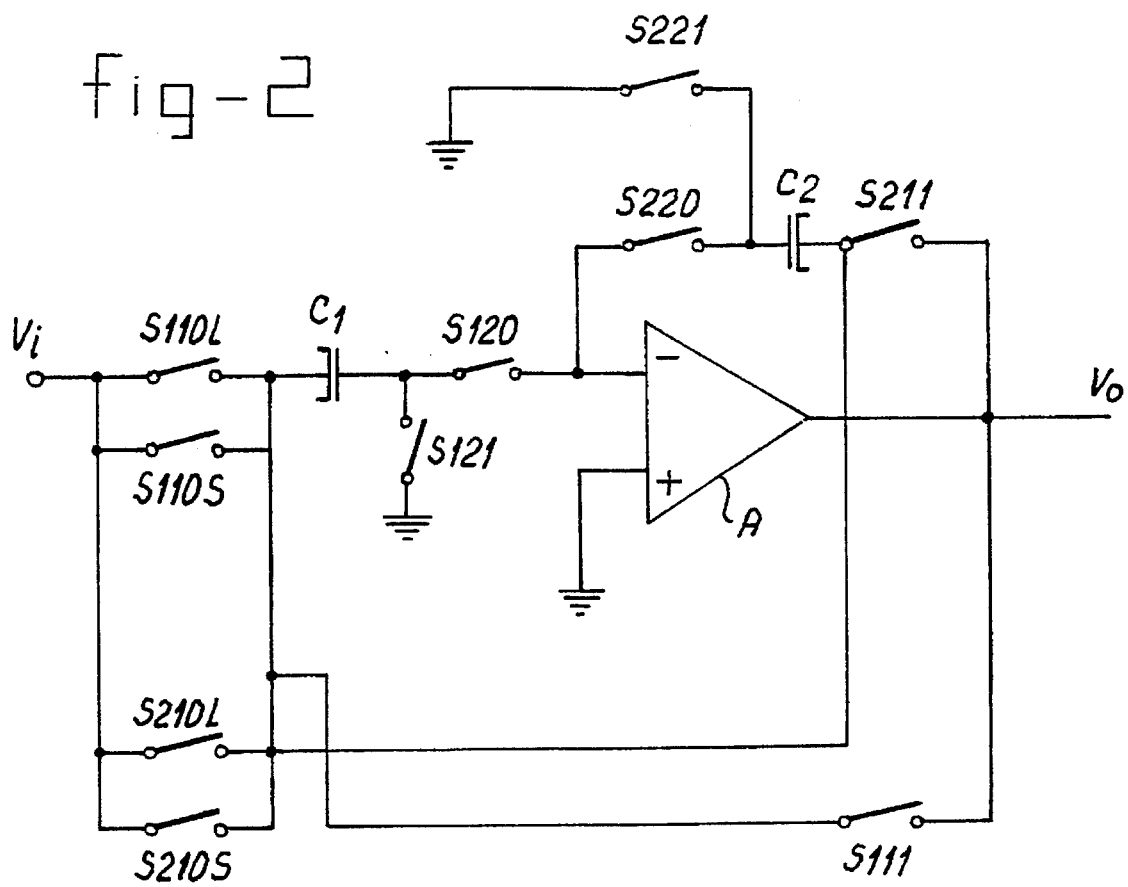
FIG. 2 shows a sample and hold arrangement according to the invention.

The sample and holds arrangement according to FIG. 2 comprises an operational amplifier A, capacitors C1 and C2 and switches S110, S111, S120, S121, S210, S211, S220 and S221. In order to improve the circuit the switches S110, S121, S210 and S221 are in a preferred embodiment relatively large switches, so that they have a low resistance in their conductive state in order to rapidly charge the capacitors C1 and C2 to the input voltage Vi. The other switches may be made smaller than S110, S121, S210 and S221, because when they are in the conductive state in most cases the operational amplifier A will be the speed-limiting element.

The accuracy of the sample and hold arrangement is influenced by the clock feedthrough occurring during switching on S111 and S211 and switching off S110 and S210. This effect is smaller when the switches are smaller, for instance, when they have minimum dimensions. In many cases a minimum dimension of S110 and S210 is not desirable because of the sample rate of the circuit. This may be solved by a parallel circuit of a large switch (S110L, S210L) and a switch having minimum dimensions (S110S, S210S). During switching off of this switching combination first of all the large switch is switched off a short time later followed by switching off the small switch. In this way switching effects of the large switch are short circuited by the small switch after which the small switch is opened. The operation of said switches will be hereinafter explained referring to FIGS. 4a to 4f.

To further reduce the inaccuracy caused by the clock feedthrough the capacitors C1 and C2 may be made relatively large and may be, for instance, 15 pF.

Switches S110L/S110S and S210L/S210S are connected at one side to the input voltage Vi. The other side of the switches S110L/S110S is on the one hand connected to capacitor C1 and on the other hand to one side of switch S111. Switch S111 is at its other side connected to the output of the operational amplifier A. The other side of C1 is connected to the one side of switch S120, as well as to the one end of switch S121. The other side of switch S121 is connected to a reference voltage, for instance ground. The other side of switch S120 is connected to the inverting input of the operational amplifier A, the non-inverting input of which receives the reference voltage (or ground).

The other side of the switches S210L and S210S are connected to both the one side of switch S211 and to the one side of capacitor C2. The other side of switch S211 is connected to the output of the operational amplifier A. The other side of capacitor C2 is connected to the one side of switch S220 and to the one side of switch S221. The other side of switch S220 is connected to the inverting input of the operational amplifier A, while the other side of switch S221 is connected to the reference voltage (or ground).

Figure 3:
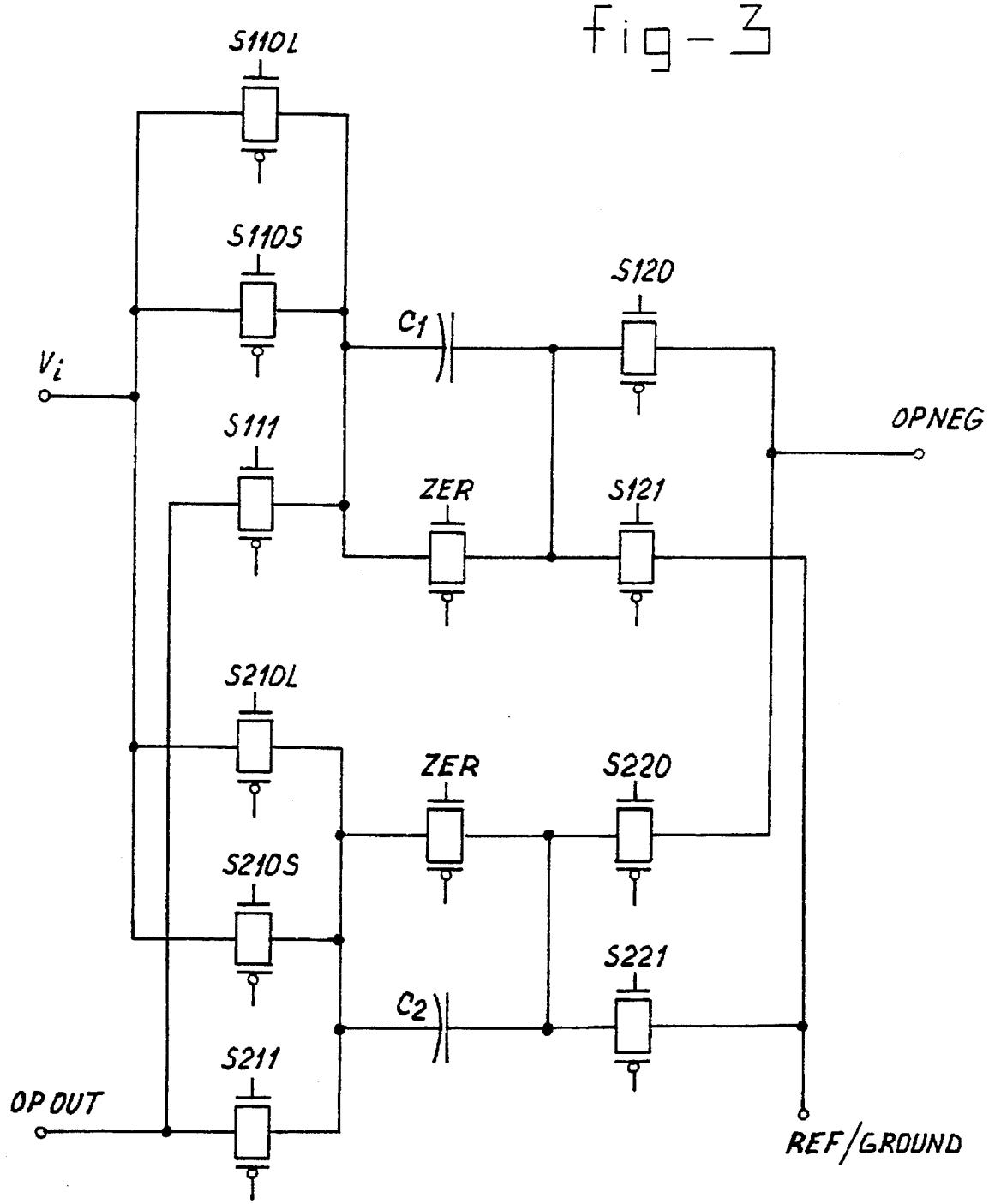
FIG. 3 shows a realization in MOS-technology of that part of FIG. 2 that relates to the switches and capacitors.

FIG. 3 shows a realization of the circuit according to FIG. 2, except for the operational amplifier A, in CMOS-technology. The point OPNEG is connected to the inverting input of the operational amplifier A, the point OPOUT to the output of the operational amplifier A and the point REF to the reference voltage (or ground). Regarding the other elements the circuit of FIG. 3 is, after FIG. 2, self explanatory and a further description thereof may be omitted.

FIGS. 4a to 4f explain the operation of the circuit according to FIGS. 2 and 3. The circuit according to FIG. 4a serves as a starting point, in which figure at a certain moment a voltage Vi(n) is applied as input signal to the sample and hold arrangement. The output voltage Vo of the operational amplifier A is still equal to the voltage vi(n-1) of the preceding sampled input signal. vi(n) is stored on capacitor C1. Therefore the switches S110L, S110S and S121 are closed, while switch S120 is opened. The output of the operational amplifier A is fed back to its inverting input through capacitor C2 by closing switches S211 and S220. The other switches are all opened. At the right side of FIG. 4a the states of the different switches is described. This also applies to the FIGS. 4b to 4f.

The switch S121 is opened (FIG. 4b), so that the capacitor C1 is not connected to the reference voltage (or ground) any more. Therefore, the voltage across C1 becomes equal to Vi(n)+Vcf121, where Vcf121 is the voltage change caused by the clock feedthrough during opening the relatively large switch S121.

Figure 4A:
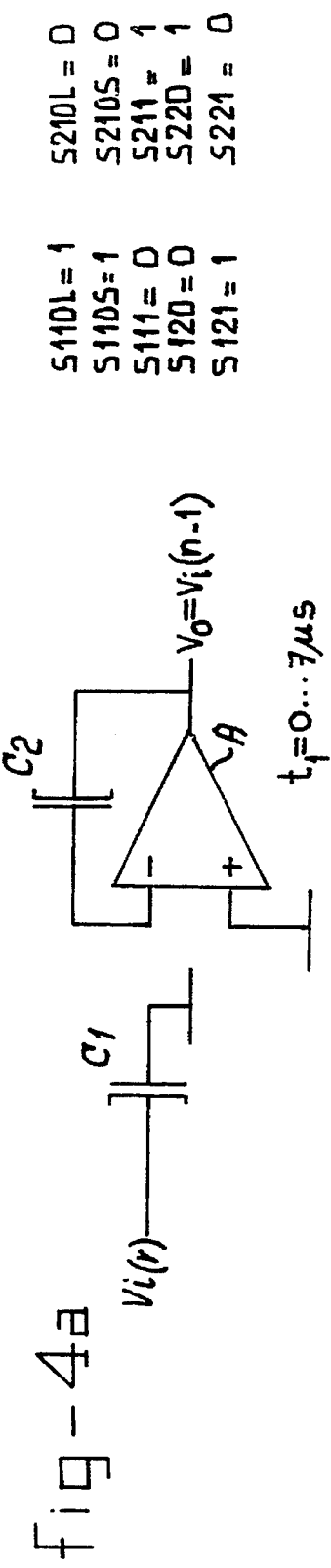
FIGS. 4a to 4f show a survey of the operation of the arrangement according to FIG. 2.
Figure 4B:
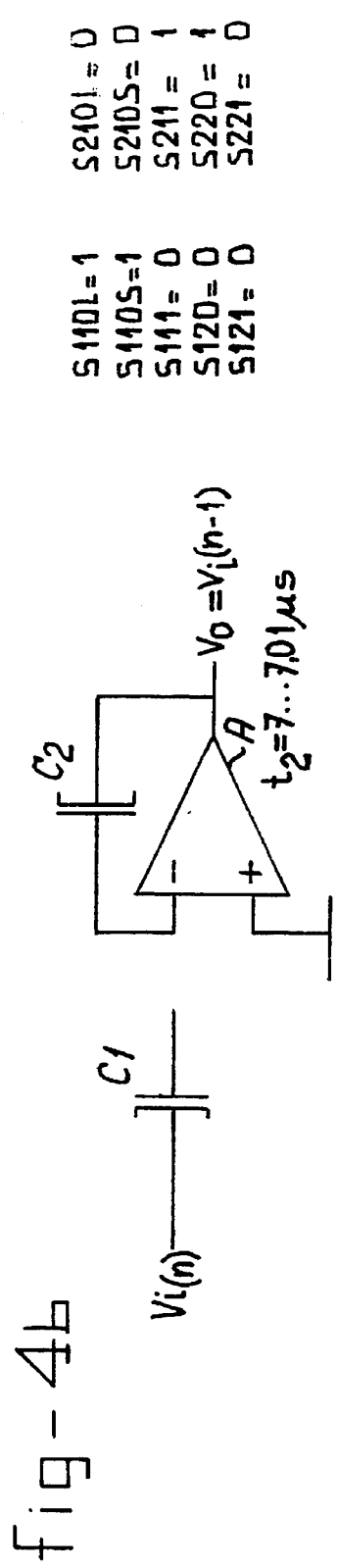
Figure 4C:
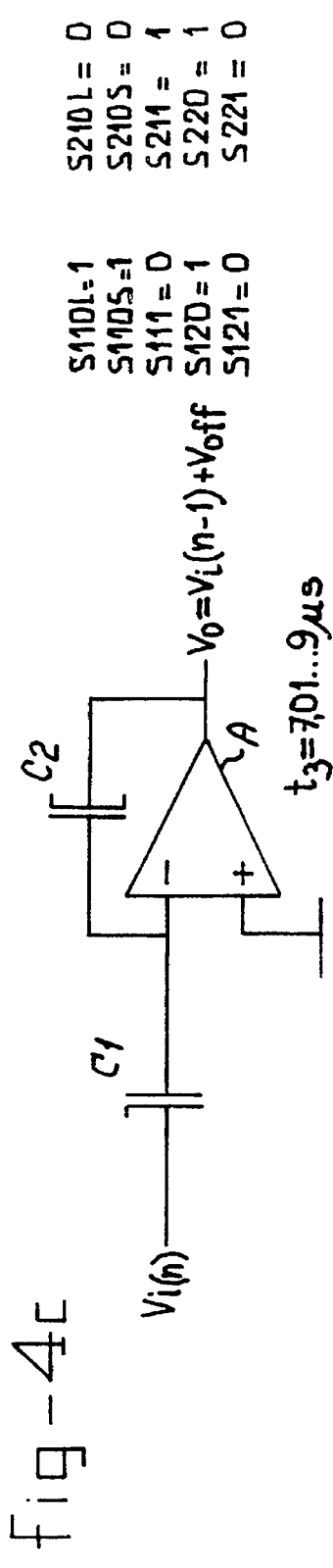

Then capacitor C1 is connected to the inverting input of the operational amplifier A through switch S120 (FIG. 4c). After a short setting time the voltage across C1 becomes equal to Vi(n)−Voff, where Voff is the offset voltage at the input of the operational amplifier A. The resulting voltages of the offset voltage and the clock feedthrough are stored in capacitor C2. Consequently Vo changes into: Vo=Vi(n-1)+Voff+Vcf, where Vcf is the total voltage change resulting from both the clock feedthrough of switch S121 and switch S120. The voltage change at the output is in the order of some mV. It is observed that the voltage across capacitor C1 is only determined by Vi(n) and Voff and not by the clock feedthrough of switches S121 and S120.

Figure 4D:
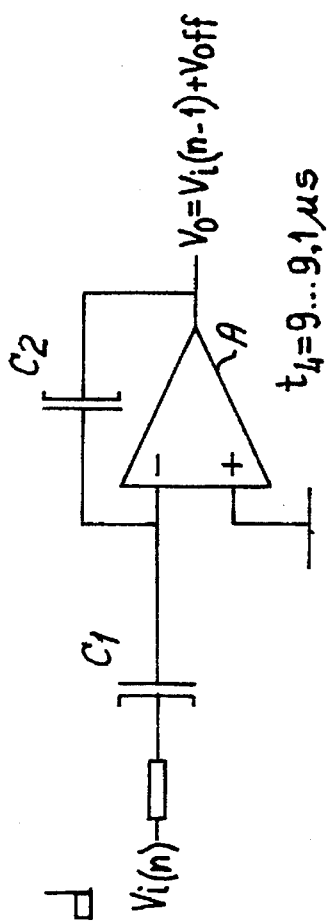

During the steps of the FIGS. 4a, 4b and 4c capacitor C1 is connected to Vi through the relatively large switch S110L and the small switch S110S. After that capacitor C1 is disconnected from Vi in preferably two steps (FIG. 4d). First the relatively large switch S110L is opened, while the small switch S110S is still closed. Therefore, the error signal caused by the clock feedthrough necessary to open switch S110L is short circuited through switch S110S. In FIG. 4d this is indicated by a resistor R. Consequently, the voltage across capacitor C1 still equals Vi(n)−Voff.

Figure 4E:
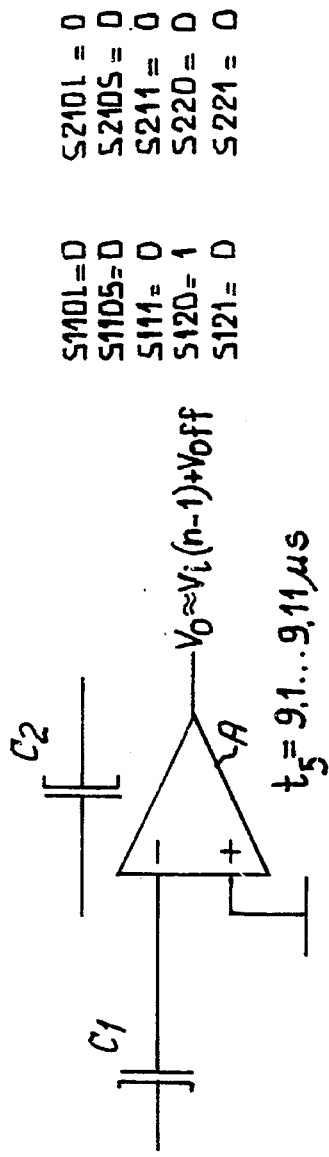

Then also switch S110S is opened, so that capacitor C1 is entirely disconnected from Vi (FIG. 4e). At the same time capacitor C2 is disconnected from the operational amplifier A by opening the switches S211 and S220. Opening switches S110S and S220 causes a small error voltage on capacitor C1 caused by the clock feedthrough, which, however, may be limited for switches S110S and S220 may have minimum dimensions. Capacitors C1 and C2 are preferably chosen relatively large, for instance 15 pF, which further reduces the last-mentioned error voltage. By choosing capacitors and C2 relatively large, moreover, the drift of the output voltage during the hold phase is reduced. It is observed that the application of a small switch S110S parallel to S110L is not essential to the invention. Switch S110S (and S210S) may be omitted. In that case the entire step corresponding to FIG. 4d is omitted.

During the situation of FIG. 4e the output voltage Vo of the sample and hold arrangement is indefinite during a short time. Therefore, the situation of FIG. 4e has to last as short as possible, preferably less than 10 ns. When this phase lasts less than 10 ns the finite limited speed of the operational amplifier A will prevent Vo from substantially changing during this indefinite period.

Figure 4F:
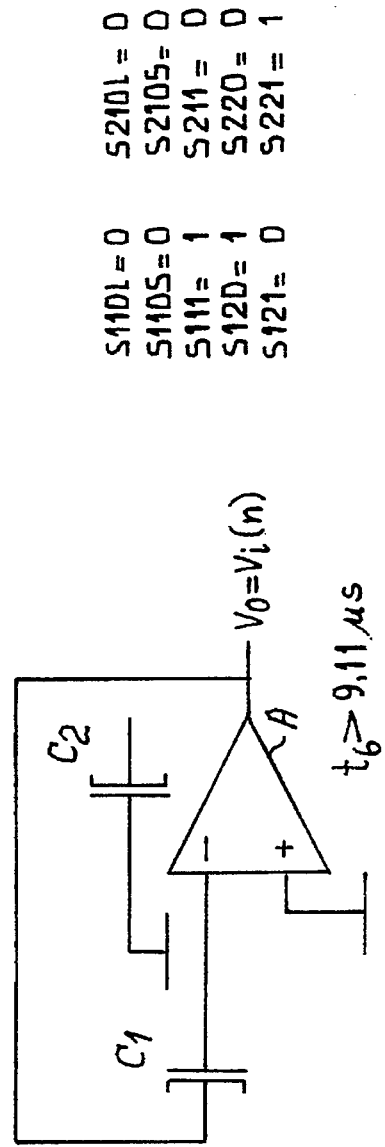

FIG. 4f shows the last step necessary to make the output voltage equal to Vi(n). Therefore switch S111 is closed, which connects the output of the operational amplifier A to the side of capacitor C1 connected to the input voltage Vi(n). Also this step introduces an error voltage caused by the clock feedthrough, but also this error voltage is very small for switch S111 may also have minimum dimensions. Neglecting the error voltages on capacitor C1 caused by the clock feedthrough from the steps 4e and 4f the voltage across capacitor C1, therefore, all the time equals Vi(n)–Voff. Because switch S120 remains closed the offset voltage Voff at the input of the operational amplifier A is added to the voltage across the capacitor C1 and the output voltage vo becomes equal to: Vo=Vi(n)–Voff+Voff=Vi(n). At the beginning of the steps carried out in the situation of FIG. 4f the side of capacitor C2 connected to the inverting input of operational amplifier A is connected to the reference voltage (or ground) by closing switch S221.

The circuit remains in the situation of FIG. 4f as long as the voltage Vi(n) has to be held and a new voltage Vi(n+1) has to be sampled. When a new voltage vi(n+1) has to be sampled switches S210L and S210S are both closed. Therefore the open side of capacitor C2 (FIG. 4f) receives the new voltage Vi(n+1) which is then stored on capacitor C2. The circuit is then in the same situation as that of FIG. 4a, except that the capacitors C1 and C2 have changed position.

The error voltage caused by offset compensation of the sample and hold circuit according to the invention depends on the hold time and the duration of the situation shown in FIGS. 4c and 4d. When a hold time of 1 ms, an offset voltage of Voff=5 mV and a period of 2 μs between the situations of FIG. 4b and FIG. 4f is supposed the error voltage in the output signal Vo will approximately be equal to (2 μs/1 ms) * 5 mV=10 μV.

FIG. 5 shows a simulation result of the operation of the circuit according to the invention in which at each voltage change from the output signal Vo it is indicated to which step of FIG. 4a to FIG. 4f it belongs. The values along both axes only serve as an example and depend on the dimensions of the switches, the capacitor values and the speed of the operational amplifier.

The accuracy of the circuit depends on the dimensions chosen. An accuracy within the range of 100 μV may be realized. In a production process having minimum channel lengths of 1.5 μm the entire circuit, including control logic and hold capacitors of 15 pF, but excluding the operational amplifier A, may be realized on a surface of $0.2.10^{-6} m^2$.

As explained above the output voltage vo of the sample and hold arrangement is only indefinite during the phase of FIG. 4e during a very short time period. In practice the output voltage will then preserve substantially the same value as it had during the phase of FIG. 4d (or 4c if no small switches S110S and S210S are applied. Therefore, after the sample and hold arrangement according to the invention a low pass filter may be used to reconstruct the original signal. Consequently, the sample and hold arrangement according to the invention may supply a discrete-time or a continuous-time signal.

I claim:

1. Sample and hold arrangement to sample an input signal comprising at least an operational amplifier having an inverting input, a non-inverting input connected to a reference voltage (or ground) and an output, a first capacitor one side of which may be connected through a first switch to the input signal, a second capacitor one side of which may be connected to the output of the operational amplifier through a second switch, said sample and hold arrangement further comprising a third switch (S210) one side of which is connected to the input signal (Vi) and the other side of which is connected to said one side of the second capacitor (C2), a fourth switch (S111) one side of which is connected to said one side of the first capacitor (C1) and the other side of which is connected to the output of the operational amplifier (A), a fifth switch (S120) one side of which is connected to the other side of the first capacitor (C1) as well as to one side of a sixth switch (S121) the other side of which is connected to the reference voltage, while the other side of the fifth switch (S120) is connected to the inverting input of the operational amplifier (A), a seventh switch (S220) one side of which is connected to the other side of the second capacitor (C2) as well as to one side of an eighth switch (S221) the other side of which is connected to the reference voltage, while the other side of the seventh switch (S220) is also connected to the inverting input of the operational amplifier (A).

2. Sample and hold arrangement according to claim 1, wherein said first, third, sixth and eighth switches (S110, S210, S121, S221) have lower current resistance than the other switches in order to sample the input voltage (Vi) faster.

3. Sample and hold arrangement according to claim 2, wherein said first switch (S110) comprises a relatively low current resistance switch (S110L) and a first relatively high current resistance switch (S110S) parallel to one another and said third switch (S210) comprises a third relatively low current resistance switch (S210L) and a third relatively high current resistance switch (S210S) parallel to one another.

4. Sample and hold arrangement according to claim 1, wherein said first and second capacitor (C1, C2) are both about 15 pF.

5. Sample and hold arrangement according to claim 1, wherein said switches (S110 . . . S221) are all made in CMOS-technology.

6. Method for the operation of the switches in sample and hold arrangement to sample an input signal comprising at least an operational amplifier having an inverting input, a non-inverting input connected to a reference voltage (or ground) and an output, a first capacitor one side of which may be connected through a first switch to the input signal, a second capacitor one side of which may be connected to the output of the operational amplifier through a second switch, said sample and hold arrangement further comprising a third switch (S210) one side of which is connected to the input signal (Vi) and the other side of which is connected to said one side of the second capacitor (C2), a fourth switch (S111) one side of which is connected to said one side of the first capacitor (C1) and the other side of which is connected to the output of the operational amplifier (A), a fifth switch (S120) one side of which is connected to the other side of the first capacitor (C1) as well as to one side of a sixth switch (S121) the other side of which is connected to the reference voltage, while the other side of the fifth switch (S120) is connected to the inverting input of the operational amplifier (A), a seventh switch (S220) one side of which is connected to the other side of the second capacitor (C2) as well as to one side of an eighth switch (S221) the other side of which is connected to the reference voltage, while the other side of the seventh switch (S220) is also connected to the inverting input of the operational amplifier (A), wherein the following steps are carried out to sample the input voltage (Vi):

a. closing or keeping closed the first, the second, the sixth and the seventh switches (S110, S211, S121, S220) and opening or keeping opened the other switches (S111, S120, S210, S221);

b. opening said sixth switch (S121);

c. closing said fifth switch (S120);

d. opening said first switch (S110);

e. opening said second and seventh switches (S211, S220);

f. closing said fourth and eight switches (S111, S221).

7. Method according to claim 6, wherein said first switch (S110) comprises a relatively low current resistance switch (S110L) and a first relatively high current resistance switch (S110S) parallel to one another and said third switch (S210) comprises a third relatively low current resistance switch (S210L) and a third relatively high current resistance switch (S210S) parallel to one another, wherein said opening of said first switch (S110) comprising two parallel switches (S110L, S110S) in step d occurs in two substeps:

d1. opening said first relatively low current resistance switch (S110L);

d2. opening said first relatively high current resistance switch (S110S).

* * * * *